(12) United States Patent
Kutz et al.

(10) Patent No.: US 8,299,951 B1
(45) Date of Patent: *Oct. 30, 2012

(54) CLOCKING ANALOG COMPONENTS OPERATING IN A DIGITAL SYSTEM

(75) Inventors: Harold Kutz, San Jose, CA (US); Timothy Williams, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/103,862

(22) Filed: May 9, 2011

Related U.S. Application Data

(63) Continuation of application No. 12/533,772, filed on Jul. 31, 2009, now Pat. No. 7,940,202.

(60) Provisional application No. 61/085,379, filed on Jul. 31, 2008.

(51) Int. Cl.
*H03M 1/50* (2006.01)

(52) U.S. Cl. ........ 341/166; 341/110; 341/118; 341/120; 341/122; 341/155

(58) Field of Classification Search .......... 341/118–121, 341/143, 144, 155, 166, 172
See application file for complete search history.

(56) References Cited

U.S. PATENT DOCUMENTS

| | | | |
|---|---|---|---|
| 3,692,982 A * | 9/1972 | McMillin | 341/141 |
| 4,504,862 A | 3/1985 | Achtstaetter | |
| 4,908,582 A | 3/1990 | Kawano et al. | |
| 5,049,766 A | 9/1991 | Van Driest et al. | |
| 5,373,292 A * | 12/1994 | Yasuda | 341/108 |
| 5,373,293 A | 12/1994 | Hirata | |
| 5,706,004 A | 1/1998 | Yeung | |
| 5,793,496 A * | 8/1998 | Morigami | 358/296 |
| 5,825,226 A | 10/1998 | Ferraiolo et al. | |
| 5,874,911 A * | 2/1999 | Kodama | 341/156 |
| 5,875,219 A | 2/1999 | Kim | |
| 6,054,887 A | 4/2000 | Horie et al. | |
| 6,154,164 A | 11/2000 | Gross, Jr. | |
| 6,154,165 A | 11/2000 | Gross, Jr. | |
| 6,300,889 B1 | 10/2001 | Piasecki | |
| 6,310,570 B1 * | 10/2001 | Rumreich et al. | 341/155 |
| 6,351,168 B1 | 2/2002 | Li et al. | |
| 6,373,302 B1 | 4/2002 | Li et al. | |
| 6,686,957 B1 | 2/2004 | Johnson et al. | |
| 6,700,943 B1 | 3/2004 | Miller | |

(Continued)

OTHER PUBLICATIONS

Actel Corporation, "Designing Clean Analog PLL Power Supply in a Mixed-Signal Environment," May 2004; 7 pages.

(Continued)

*Primary Examiner* — Linh Nguyen

(57) ABSTRACT

A system and method are provided for operating first and second components in first and second domains. In one embodiment, the method includes: generating a plurality of clock signals shifted relative to one another; operating a first component in a first domain using a first one of the plurality of clock signals; operating a second component in a second domain using a second one of the plurality of clock signals selected using a selection component; and comparing a present output of the second component to a stored value, determining whether a variation between the present output and the stored value is greater than a threshold, and, if the variation is greater than the threshold, using a controller to cause the selection component to select a third clock signal from the plurality of clock signals that is shifted relative to the second clock signal to drive the second component.

20 Claims, 6 Drawing Sheets

U.S. PATENT DOCUMENTS

| | | | |
|---|---|---|---|
| 6,795,514 B2 * | 9/2004 | Gresham | 375/354 |
| 6,836,152 B2 | 12/2004 | Karasudani | |
| 6,950,044 B1 | 9/2005 | Piasecki et al. | |
| 6,956,518 B1 * | 10/2005 | Piasecki et al. | 341/166 |
| 6,987,825 B1 * | 1/2006 | Yoshimura et al. | 375/371 |
| 7,327,400 B1 * | 2/2008 | Greenberg | 348/536 |
| 7,343,387 B2 * | 3/2008 | Reese | 708/200 |
| 7,496,781 B2 | 2/2009 | Tamura et al. | |
| 7,609,756 B2 | 10/2009 | Wood | |
| 7,620,131 B2 | 11/2009 | May et al. | |
| 7,660,376 B2 | 2/2010 | Wang | |
| 7,688,242 B2 | 3/2010 | Shimizu et al. | |
| 7,940,202 B1 * | 5/2011 | Kutz et al. | 341/166 |
| 2005/0030206 A1 * | 2/2005 | Li | 341/53 |
| 2005/0151678 A1 | 7/2005 | Bilinskis et al. | |
| 2006/0012498 A1 | 1/2006 | Shim et al. | |
| 2006/0038596 A1 | 2/2006 | Wang | |
| 2006/0227019 A1 | 10/2006 | Somayajula | |
| 2008/0030387 A1 | 2/2008 | Sheng et al. | |

OTHER PUBLICATIONS

RoboClockII CY7B994V/CY7B993V, "High-Speed Multi-Phase PLL Clock Buffer," Cypress Semiconductor Corporation, Jun. 2000, pp. 1-14; 14 pages.

USPTO Non-Final Rejection for U.S. Appl. No. 09/533,198 dated Apr. 12, 2001; 7 pages.

USPTO Non-Final Rejection for U.S. Appl. No. 09/533,740 dated May 09, 2001; 6 pages.

USPTO Non-Final Rejection for U.S. Appl. No. 12/533,772 dated Sep. 22, 2010; 13 pages.

USPTO Notice of Allowance for U.S. Appl. No. 09/533,198 dated Aug. 14, 2001; 2 pages.

USPTO Notice of Allowance for U.S. Appl. No. 09/533,740 dated Sep. 10, 2001; 1 page.

USPTO Notice of Allowance for U.S. Appl. No. 12/533,772 dated Jan. 6, 2011; 7 pages.

* cited by examiner

CLOCKING ANALOG COMPONENTS OPERATING IN A DIGITAL SYSTEM

This application is a continuation of U.S. application Ser. No. 12/533,772, filed Jul. 31, 2009, now U.S. Pat. No. 7,940,202, which claims the benefit of priority under 35 U.S.C. 119(e) to U.S. Provisional Patent Application Ser. No. 61/085,379, filed Jul. 31, 2008, both of which are incorporated by reference herein.

TECHNICAL FIELD

This disclosure relates generally to analog circuits, and more particularly to operating analog components in a digital system.

BACKGROUND

In mixed digital/analog systems, it is known that operations of digital components can have adverse effects on the operation of the analog components. For example, a digital component processing data generated by an Analog to Digital Converter (ADC) can have adverse effects on the operation of the ADC, namely due to noise generated by operation of the digital component. An operating clock signal supplied to the digital component may be terminated while the ADC operates. In more complex digital/analog systems having many digital components, the operations of the digital components cannot be stopped for operations of the analog component, and thus the adverse effects on the analog components can still exist.

SUMMARY

The following is a summary of embodiments of the invention in order to provide a basic understanding of some aspects. This summary is not intended to identify key/critical elements of the embodiments or to delineate the scope of the embodiments. Its sole purpose is to present some concepts in a simplified form as a prelude to the more detailed description that is presented later.

In one example, a clock generation component is configured to receive a master clock and generate a plurality of clock signals that are shifted relative to one another for a chip having an analog domain and a digital domain. A first selection component is configured to select a first one of the generated clock signals and drive the digital domain according to the first clock signal. A second selection component is configured to select a second one of the generated clock signals that is shifted relative to the first clock signal currently used to drive the digital domain for driving an analog component of the analog domain.

DETAILED DESCRIPTION OF EXAMPLE EMBODIMENTS

Several examples of the present application will now be described with reference to the accompanying drawings. Various other examples of the invention are also possible and practical. This application may be exemplified in many different forms and should not be construed as being limited to the examples set forth herein.

Figure 1A:
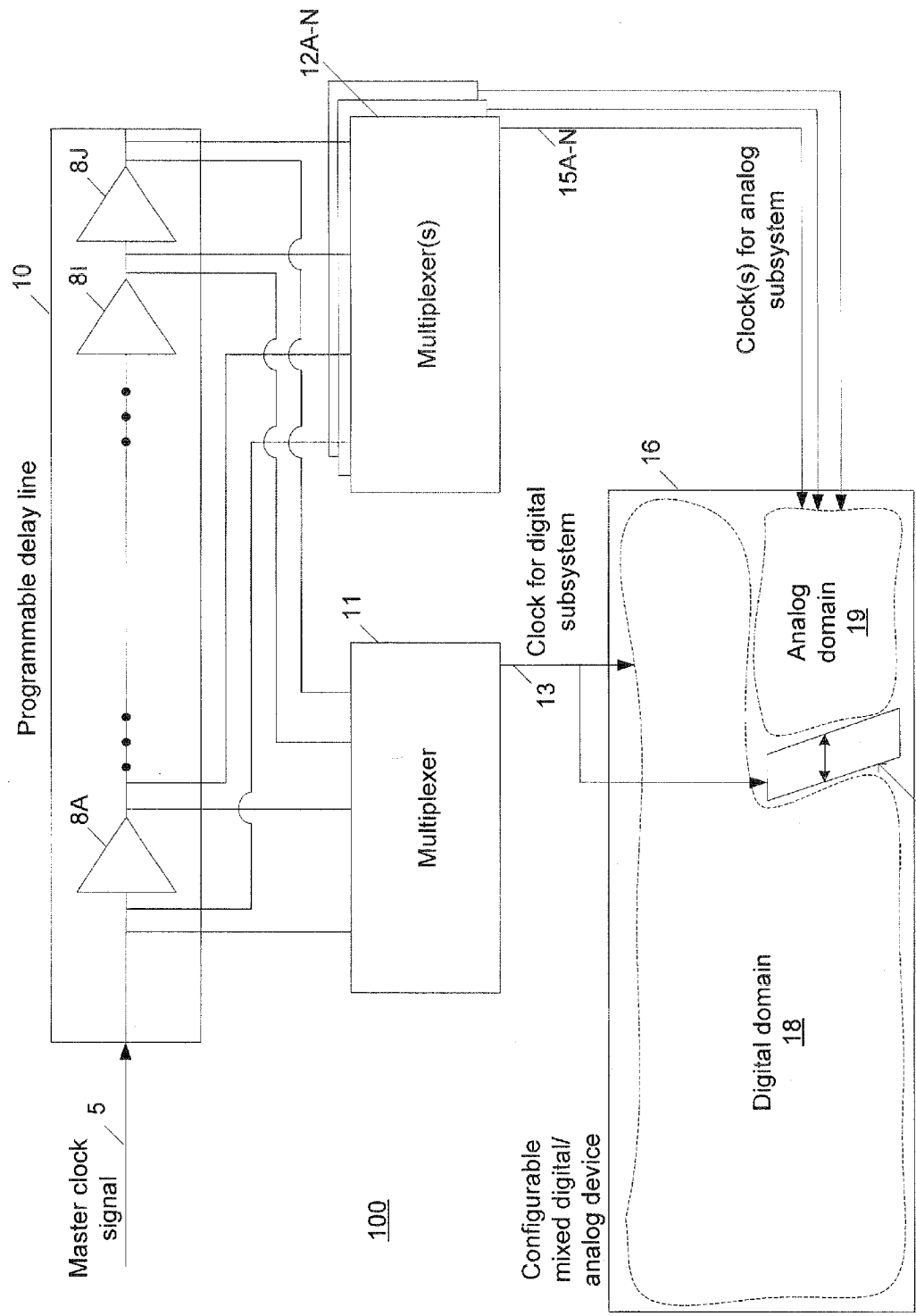
FIG. 1A shows a system operating an analog domain using one or more clocks that are skewed relative to a clock used in the digital domain in an embodiment.

FIG. 1A shows a system operating an analog domain using one or more clocks that are skewed relative to a clock used in the digital domain in an embodiment.

The system 100 includes a configurable mixed digital/analog device 16 having a digital domain 18 and an analog domain 19. The digital components of the domain 18 are clocked according to the clock signal 13 selected by the multiplexer 11. An analog component of the domain 19 is clocked according to one of the clock signals 15A-N selected by one of the multiplexers 12A-N.

The selected clock signal for the analog component is skewed with respect to the selected clock for the digital domain 18, which causes the analog component to operate on received analog signals in-between pulses that time operation of the digital domain 18. As a result, at the instant the analog component operates, the noise generated by the digital domain 18 at the pulses is either not present or minimal. An output generated by the analog component may have a relatively high signal to noise ratio.

Other illustrated components of the system 100 include the synchronization circuitry 20 and the programmable delay line 10, each of which will be described in turn. The synchronization circuitry 20 re-clocks data generated by the analog component to correspond with the clock 13 used by the digital domain The synchronization circuitry 20 may utilize a flip flop, for example, and will be described later in greater detail.

The programmable delay line 10 includes buffers 8A-8J or other delay components, only a portion of which are illustrated for ease of explanation. In one example, ten of the buffers 8A-8J are provided in the programmable delay line 10, although it should be understood that there can be any number of the buffers 8A-8J in other examples. The output of buffer 8A is phase delayed with respect to the master clock signal 5, and the output of buffer 81 is phase delayed with respect to both the master clock signal 5 and the output of buffer 8A, and so on. Accordingly, each of the buffers 8A-8J outputs a different clock signal that corresponds to the master clock signal 5. The programmable delay line 10 may also provide a signal that is not delayed, or negligibly delayed, with respect to the master clock signal 5.

Referring again to the one or more multiplexers 12A-N, these multiplexer(s) can vary in number depending on implementation. It should be understood that some implementations include only one multiplexer to select a clock for the analog component. When there are more than one of the multiplexers 12A-N, each of the multiplexers 12A-N may select a different one of the clock signals for a particular analog component of the analog domain 19. This allows various configurations such as different analog components of the domain 19 to operate out-of-phase with each other as well as being out-of-phase with the digital components, or this allows for one analog component to operate out-of-phase with the digital domain 18 while another analog component operates in-phase with the digital domain 18.

Referring again to the multiplexer 11, it is noted that a variation of the system 100 may include more than one selection component to select clock signals for the digital domain 18. In such an example, different portions of the digital domain 18 could operate out-of-phase with respect to each other.

A non-exhaustive list of examples of the analog component includes Digital to Analog Converters (DACs), Analog to Digital Converters (ADCs), and switched capacitor amplifiers. A non-exhaustive list of examples of the digital components includes timers, Pulse Width Modulators (PWMs), Universal Asynchronous Receiver Transmitters (UARTs), and Serial Port Interfaces (SPIs).

Figure 1B:
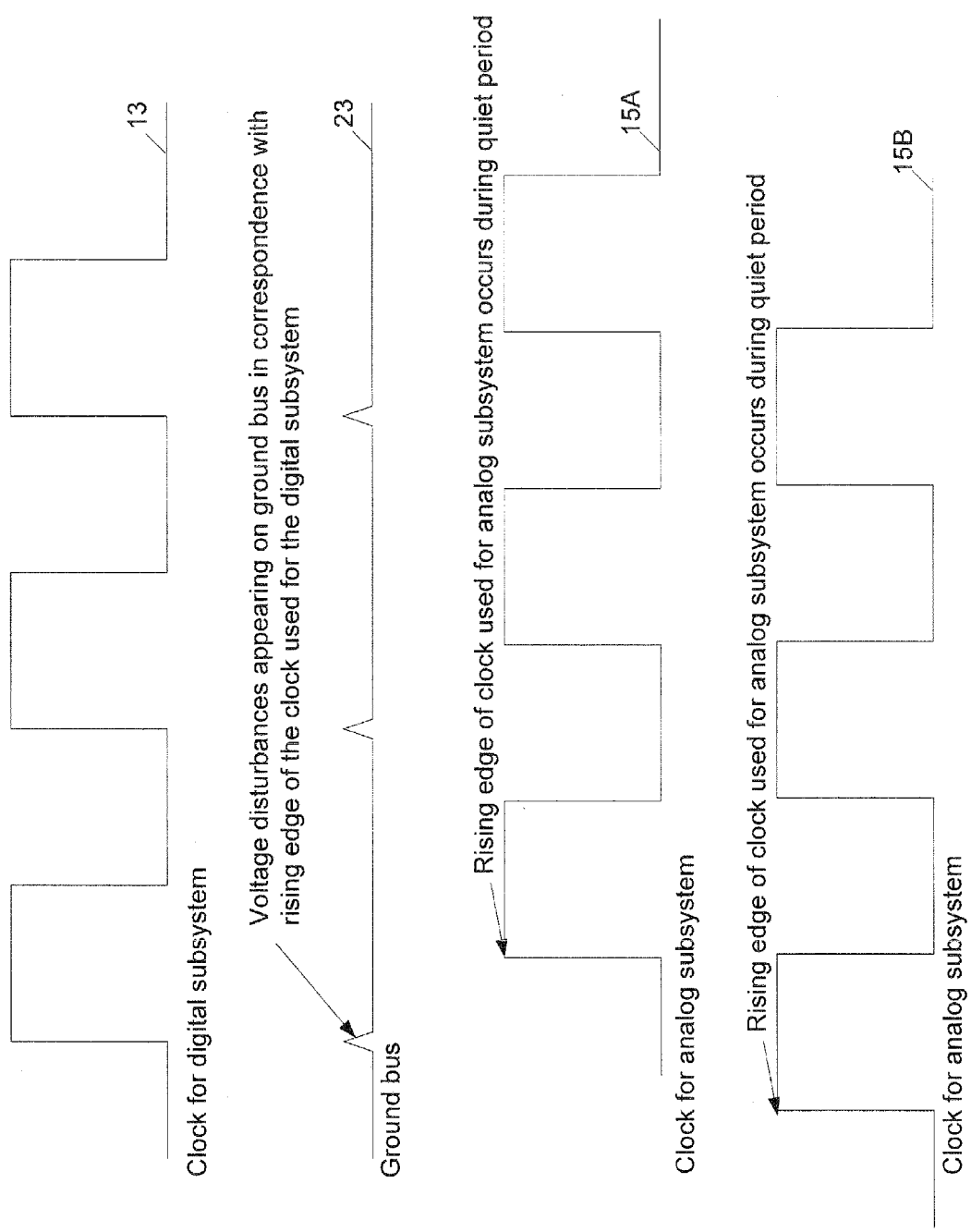
FIG. 1B illustrates skew between the clocks shown in FIG. 1A in an embodiment.

FIG. 1B illustrates skew between the clocks shown in FIG. 1A in an embodiment.

The clock signal 13 selected by the multiplexer 11 is a square wave pattern. The digital domain 18 becomes active on a rising edge of the square wave clock signal 13. In accordance with the digital domain 18 becoming active, voltage disturbances can appear in the system 100, such as on the ground bus 23. As illustrated, the voltage disturbances correspond to the rising edge of the square wave clock signal 13. It should be understood that, in some examples, there may be additional voltage disturbances (not shown) associated with the falling edge of the clock 13.

The clock signals 15A and 15B selected for the analog components are skewed with respect to the clock signal 13. For example, the clock signal 15A is delayed with respect to the clock signal 13, whereas the clock signal 15B operates ahead of the clock signal 13.

In either case, the rising edge of the clock signals 15A and 15B occur during quiet instants in the system 100. For example, the rising edges of the clock signals 15A and 15B are shifted away in time from the voltage disturbances. As a result, an output generated by the analog component has a relatively high signal to noise ratio, regardless of whether the analog component operates before or after the digital components.

Figure 2:
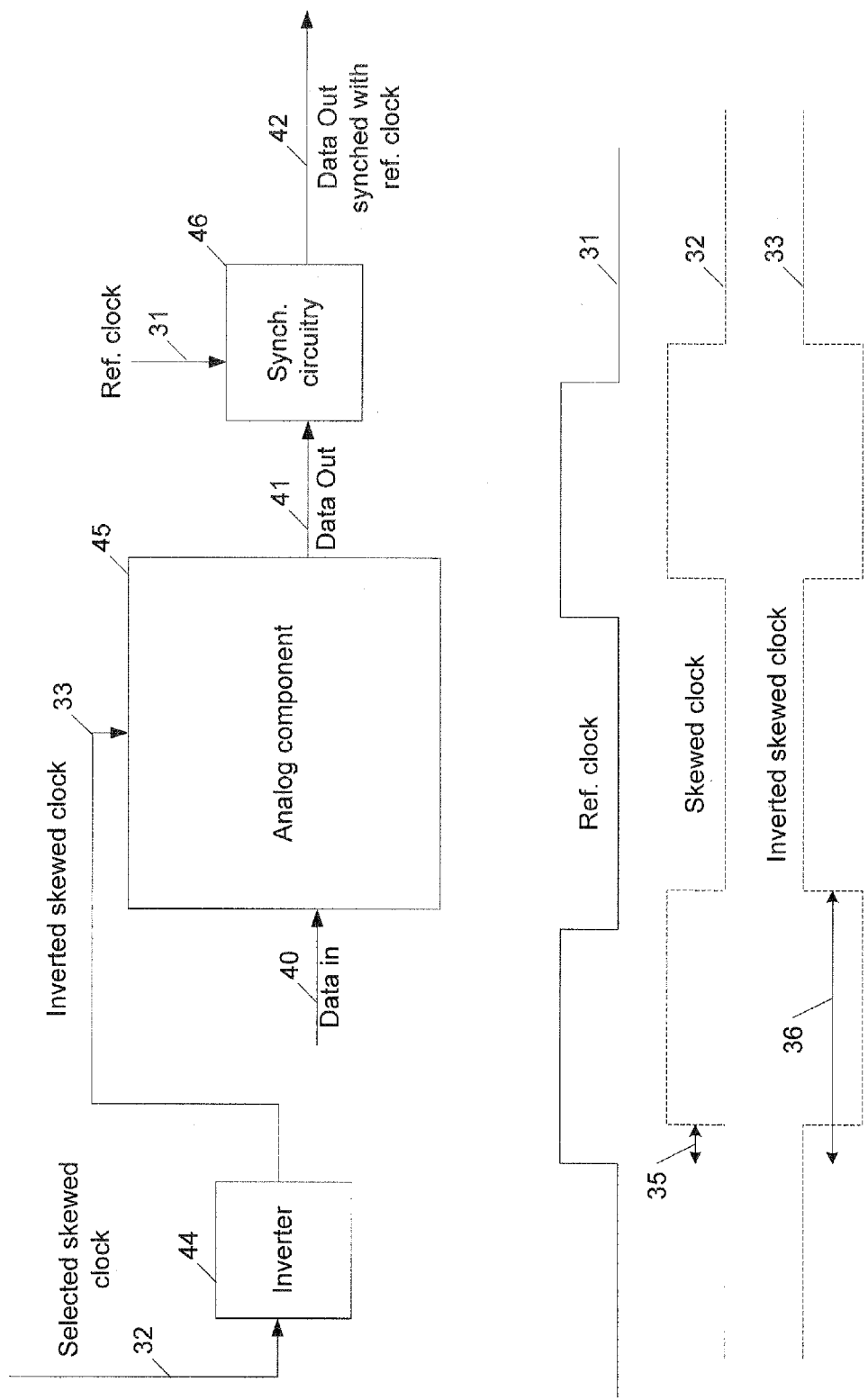
FIG. 2 shows a synchronization scheme between the domains in an embodiment.

FIG. 2 shows a synchronization scheme between the domains in an embodiment.

A clock 32 for the analog domain of a chip is skewed relative to a reference clock 31 for the digital domain of the chip. In this example, a delay 35 between the clocks 31 and 32 is relatively small, on the order of 1-10 nanoseconds. In other examples, the delay 35 between the clocks 31 and 32 can be any amount.

The selected skewed clock 32 is fed into an inverter 44 to generate an inverted skewed clock 33. A delay 36 between rising edges of the clocks 31 and 33 is larger than the delay 35.

The inverted skewed clock 33 is then used to time operation of an analog component 45 for processing input 40. Because the inverted skewed clock 33 is skewed with respect to the reference clock 31, the output 41 has a relatively large signal to noise ratio.

The synchronization circuitry 46, which comprises a flip flop or any circuit with a similar latching function, re-clocks the output 41 according to the reference clock 31. Due in part to the inversion by the inverter 44, the synchronization circuitry 46 has sufficient set up and hold time to re-clock the data 41. The data 42 output by the synchronization circuitry 46 may be passed to the digital domain for operation thereon by digital components operating according to the reference clock 31.

It should be apparent that other examples may not utilize the inverter. Furthermore, even in systems having the inverter 44, the inverter can be bypassed in particular cases where synchronization can be performed on a non-inverted skewed clock signal.

It should be apparent that the synchronization circuitry 46 can be arranged differently with respect to the analog component 45 in some examples. For example, in a system where the analog component 45 is a Digital to Analog converter, the synchronization circuitry 46 may be configured at the input to the Digital to Analog converter, since that is where the digital data is sampled.

Figure 3:
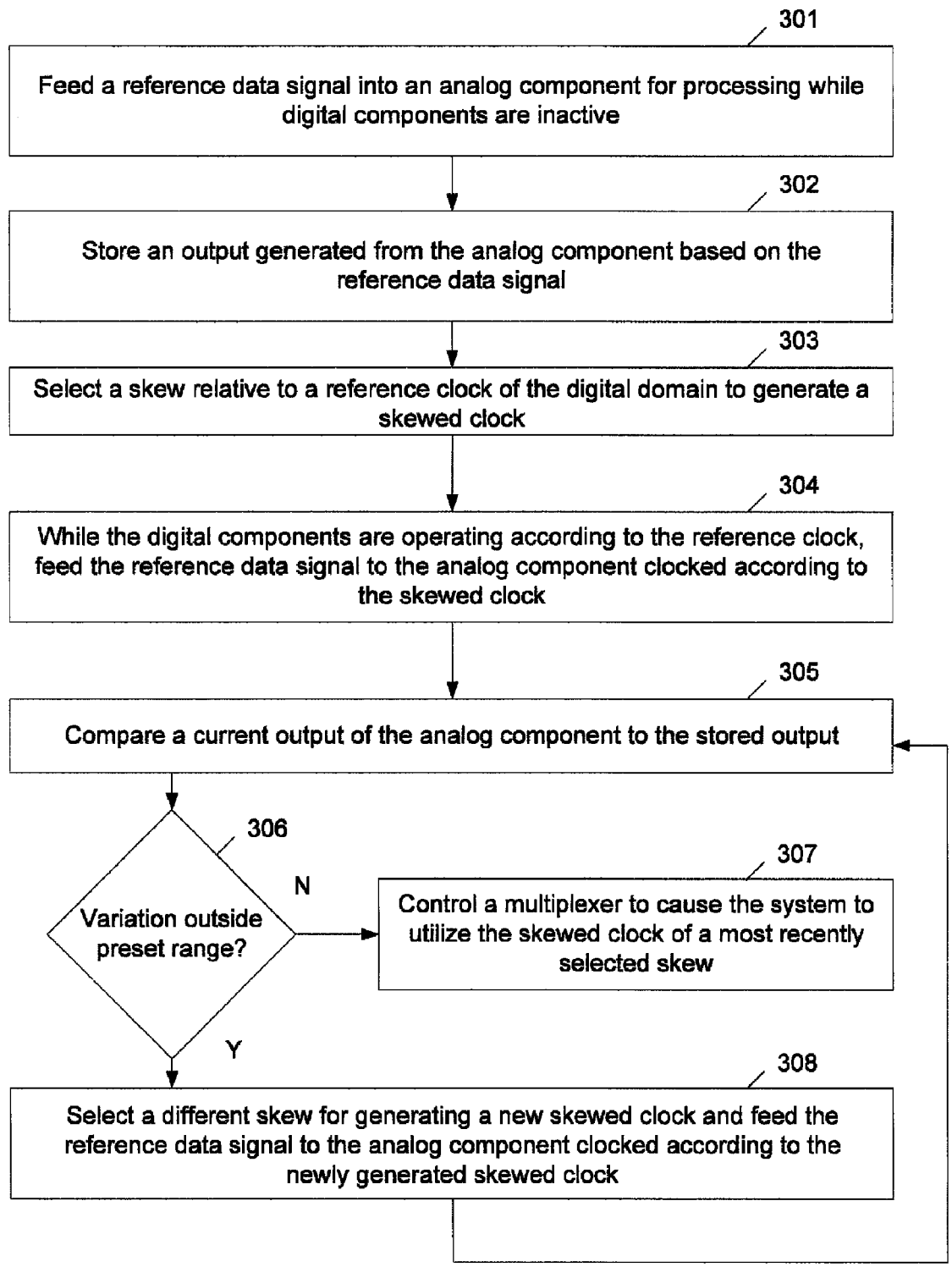
FIG. 3 shows how the skew of the clock used in the analog domain of a mixed analog/digital system can be calibrated.

FIG. 3 shows how the skew of the clock used in the analog domain of a mixed analog/digital system can be calibrated.

As previously mentioned, the amount of skew between the clock signal used for the digital domain and the clock signal used for the analog domain is selectable. For example, the amount of skew can be set within the range of 1-10 nanoseconds.

Several factors can affect whether a particular skew will achieve a relatively strong signal to noise ratio from the analog component. For example, ambient temperature, which digital components of the digital domain are operating, a current value of the power supply voltage, and other factors can each affect whether a particular skew is adequate.

Accordingly, in one embodiment, a calibration scheme is used to determine an optimal amount of delay between the clock signals and set the multiplexers accordingly. The scheme can be implemented using software or logic, for example. One example of such a calibration scheme is described below.

In block 301, the system feeds a reference data signal into an analog component for processing while the digital domain is inactive. At least portions of the digital domain may be powered down, for example. In block 302, the system stores an output generated from the analog component based on the reference data signal.

In block 303, the system selects a skew relative to a reference clock of the digital domain to generate a skewed clock. In block 304, the system feeds the reference data signal to the analog component clocked according to the skewed clock.

In block 305, the system compares a current output of the analog component to the stored output. If a variation according to the comparison is within a preset range in diamond 306, then in block 307 the system controls a multiplexer to cause the system to utilize the skewed clock of a most recently selected skew. Otherwise, if the variation according to the comparison is outside the preset range in diamond 306, then in block 308 the system selects a different skew for generating a new skewed clock and feeds the reference data signal to the analog component clocked according to the newly generated skewed clock before returning to block 305.

Figure 4:
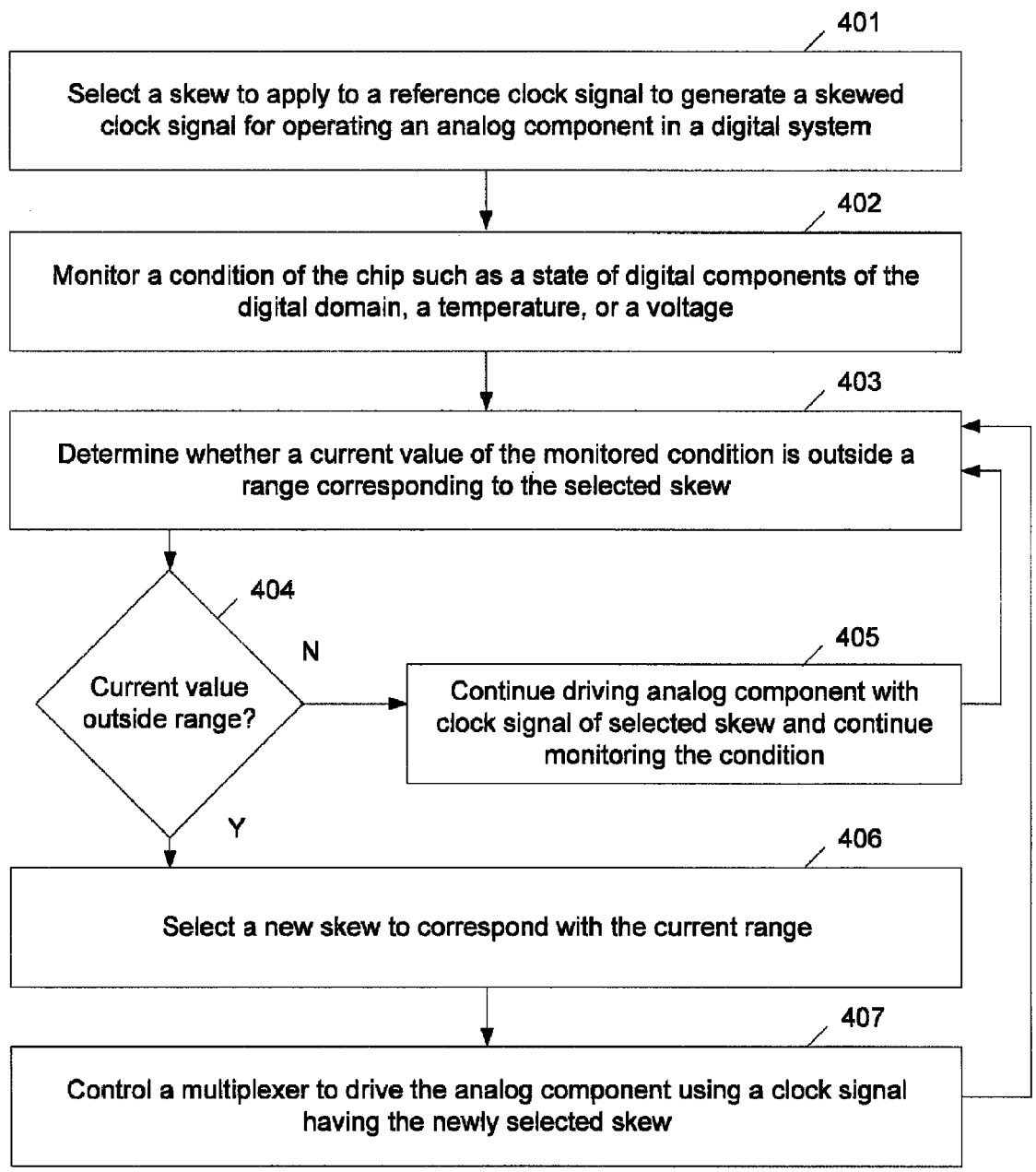
FIG. 4 shows how the skew of a clock used in the analog domain can be varied over time according to a condition of the chip such as temperature in an embodiment.

FIG. 4 shows how the skew of a clock used in the analog domain can be varied over time according to a condition of the chip such as temperature in an embodiment.

The clock used for the analog component can be dynamically varied according to a change in conditions. For example, as previously mentioned, several factors affect whether a particular skew will be adequate to achieve a relatively strong signal to noise ratio from the analog component. As the condition of a chip changes over time, dynamic variation in the skew of the clock used to clock the analog component can maintain a signal to noise ratio of the analog component output.

Accordingly, in one embodiment, a monitoring scheme is used to identify changes in conditions and vary the selected skew over time. The scheme can be implemented using software or logic, for example. One example of such a monitoring scheme is described below.

In block 401, the system selects a skew to apply to a reference clock signal to generate a skewed clock signal for operating an analog component in a digital system. In block 402, the system monitors a condition of the chip such as but not limited to a state of particular digital components of the digital domain, a temperature (either ambient or a temperature of any component of the chip), or a voltage. In block 403, the system determines whether a current value of the monitored condition is outside a range corresponding to the selected skew.

If the current value is within the range in diamond 404, then in block 405 the system continues driving the analog component with the clock signal of the selected skew and continues monitoring the condition per block 403. Otherwise, if the current value is outside the range in diamond 404, then in block 406 the system selects a new skew to correspond with the current range. In block 407, the system controls a multiplexer to drive the analog component using a clock signal having the selected skew.

Figure 5:
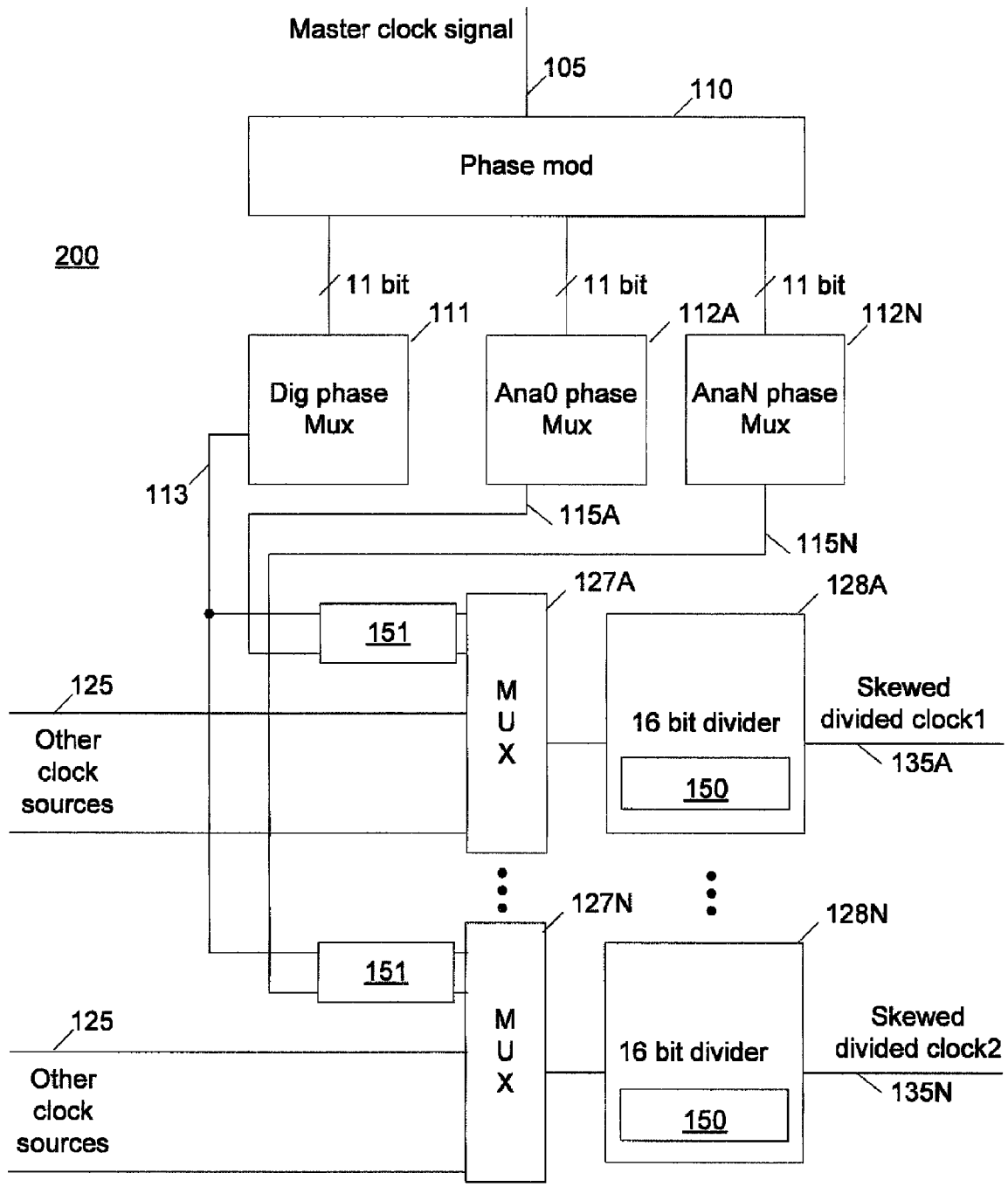
FIG. 5 shows another example of a system operating an analog domain using one or more clocks that are skewed relative to a clock used in the digital domain in an embodiment.

FIG. 5 shows another example of a system operating an analog domain using one or more clocks that are skewed relative to a clock used in the digital domain in an embodiment.

The system 200 includes a phase module 110 to receive a master clock signal 105 and generate eleven clock signals that are each skewed with respect to one another. A delay between any one of the generated clock signals and an immediately preceding clock signal is 1/10th the amount of delay between a least delayed one of the clock signals and a most delayed one of the clock signals. Stated another way, there are N+1 generated clock signals, and a delay between any one of the generated clock signals and an immediately preceding clock signal is 1/Nth the amount of delay between a least delayed one of the clocks signals and a most delayed one of the clock signals The delay between the least delayed one of the clock signals and a most delayed one of the clock signals can be any amount, for example ten nanoseconds in an embodiment.

The generated clock signals are provided to a multiplexer 111 to select a clock for the digital domain and to multiplexers 112A-N to select clocks to be used by analog components of the analog domain. As there are a plurality of the "analog" multiplexers 112A-N in the present example, the system 200 can operate an analog component at a clock that is skewed with respect to the clock used by the digital components and with respect to a clock used by another analog component in the analog domain. The multiplexer 111 provides the selected clock to the digital domain (not shown) for clocking the same.

The selected clocks are provided to the additional multiplexers 127A-N, which are each connected to a clock input of a respective analog component of the analog domain (not shown).

The multiplexers 127A-N can select between a corresponding one of the analog signals 115A-N and other clock signals 113 and 125. For example, multiplexer 127A can send clock signal 115A (that is skewed relative to the digital clock signal 113) to a corresponding analog component. Also, it is possible for the multiplexer 127A to provide the digital clock signal 113 to the corresponding component, which could be useful in cases where a feedback indicates that a current configuration of the system 200 does not necessitate clocking the analog component differently than the digital domain. The multiplexers 127A-N also each receive other clocks 125, which may or may not be based on the master clock signal, and provide additional possibilities for clocking the corresponding analog component.

Dividers can also be used for the selected clock. For example, the system 200 includes 16-bit dividers 128A-N, which may each divide the selections of their corresponding multiplexer 127A-N. This is useful when the analog component is to run at a ratio of the digital clock, such as ¼ the frequency. It should be understood that such divided clock may still be skewed relative to the digital clock 113.

The dividers 128A-N may each include a re-synchronization component 150. Such component 150 removes the delay caused by the dividing function thereby synchronizing the divided skewed clocks 135A-N with the selected skewed clock outputs from the multiplexers 127A-N.

Phase selectors 151 can also be used if the dividers 128A-N are used. Phase selectors 151 receive the digital clock 113 and a corresponding one of the analog clocks 115A-N and output the most delayed thereof. The phase selectors 151 then pass this most delayed signal to the dividers 128A-N for clocking the same, which can be used to provide setup and hold time for the divide operation on the selected clock.

It is noted that the aforementioned calibration controller can send its control signal to any of the multiplexers 111, 112A-N and 127A-N, to calibrate the amount of skew on the clock used to time operation of a particular analog component. Likewise, the aforementioned monitoring controller can send its control signal to any of the multiplexers 111, 112A-N and 127A-N, to dynamically vary the amount of skew on the clock used to time operation of a particular analog component according to the monitoring of a condition of the system 200.

Several examples have been described above with reference to the accompanying drawings. Various other examples are also possible and practical. The system may be exemplified in many different forms and should not be construed as being limited to the examples set forth above.

The figures listed above illustrate examples of the application and the operation of such examples. In the figures, the size of the boxes is not intended to represent the size of the various physical components. Where the same element appears in multiple figures, the same reference numeral is used to denote the element in all of the figures where it appears.

Only those parts of the various units are shown and described which are necessary to convey an understanding of the examples to those skilled in the art.

The system described above can use dedicated processor systems, micro controllers, programmable logic devices, or microprocessors that perform some or all of the operations described herein. For example, any of such devices may be used to control switching in a shared bus scheme. Some of the operations described above may be implemented in software and other operations may be implemented in hardware.

The invention claimed is:

1. A method, comprising:
   generating a plurality of clock signals shifted relative to one another;
   operating a first component in a first domain using a first one of the plurality of clock signals;
   operating a second component in a second domain using a second one of the plurality of clock signals selected using a selection component; and
   comparing a present output of the second component to a stored value, determining whether a variation between the present output and the stored value is greater than a threshold, and, if the variation is greater than the threshold, using a controller to cause the selection component to select a third clock signal from the plurality of clock signals that is shifted relative to the second clock signal to drive the second component.

2. The method of claim 1, wherein the second clock signal is shifted relative to the first clock signal.

3. The method of claim 1, wherein the first component is a digital component and the first domain is a digital domain.

4. The method of claim 3, wherein the second component is an analog component and the second domain is an analog domain.

5. The method of claim 3, further comprising if the variation is greater than the threshold, continuing to compare the present output of the second component to the stored value while operating the second component using the second one of the plurality of clock signals.

6. A system, comprising:
a first component in a first domain driven by a first clock signal;
a selection component coupled to a second component in a second domain, the selection component configured to select a second clock signal from a plurality of clock signals that are shifted relative to one another to drive the second component;
a controller coupled to the selection component, the controller configured to monitor the second component and determine whether a current condition is outside a set range, and, if the current condition is outside the set range, cause the selection component to select a third clock from the plurality of clock signals that is shifted relative to the second clock signal to drive the second component.

7. The system of claim 6, wherein the second clock signal is shifted relative to the first clock signal.

8. The system of claim 6, wherein the first component is a digital component and the first domain is a digital domain.

9. The system of claim 8, wherein the second component is an analog component and the second domain is an analog domain.

10. The system of claim 8, further comprising a configurable mixed analog/digital integrated circuit, and wherein the configurable mixed analog/digital integrated circuit comprises the first component and the second component.

11. The system of claim 8, wherein the current condition monitored comprises a state of the digital component, an ambient temperature of the system, a temperature of the second component, or a voltage supplied to or from the second component.

12. The system of claim 6, further comprising a clock generation component configured to receive a master clock and generate the plurality of clock signals, and wherein the clock generation component comprises a programmable delay line.

13. The system of claim 6, wherein the selection component comprises a multiplexer.

14. A system, comprising:
a first component in a first domain driven by a first clock signal;
a selection component coupled to a second component in a second domain, the selection component configured to select a second clock signal from a plurality of clock signals that are shifted relative to one another to drive the second component;
a controller coupled to the selection component, the controller configured to compare a present output of the second component to a stored value, determine whether a variation between the present output and the stored value is greater than a threshold, and, if the variation is greater than the threshold, cause the selection component to select a third clock from the plurality of clock signals that is shifted relative to the second clock signal to drive the second component.

15. The system of claim 14, wherein the second clock signal is shifted relative to the first clock signal.

16. The system of claim 14, wherein the first component is a digital component and the first domain is a digital domain.

17. The system of claim 16, wherein the second component is an analog component and the second domain is an analog domain.

18. The system of claim 17, further comprising a configurable mixed analog/digital integrated circuit, and wherein the configurable mixed analog/digital integrated circuit comprises the first component and the second component.

19. The system of claim 14, further comprising a clock generation component configured to receive a master clock and generate the plurality of clock signals, and wherein the clock generation component comprises a programmable delay line.

20. The system of claim 14, wherein the selection component comprises a multiplexer.

* * * * *